United States Patent
Ali et al.

(10) Patent No.: US 7,940,541 B2
(45) Date of Patent: May 10, 2011

(54) BIT CELL DESIGNS FOR TERNARY CONTENT ADDRESSABLE MEMORY

(75) Inventors: Shahid Ali, New Delhi (IN); Sharad Gupta, Uttar Pradesh (IN); Sunil Kumar Misra, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 254 days.

(21) Appl. No.: 12/124,152

(22) Filed: May 21, 2008

(65) Prior Publication Data

US 2009/0290400 A1     Nov. 26, 2009

(51) Int. Cl.
*G11C 15/00*     (2006.01)

(52) U.S. Cl. .............. 365/49.17; 365/49.1; 365/49.11

(58) Field of Classification Search ............ 365/49.17, 365/49.1, 49.11
See application file for complete search history.

(56) References Cited

U.S. PATENT DOCUMENTS

| | | | | |
|---|---|---|---|---|
| 5,933,363 A * | 8/1999 | Shindo | | 365/49.17 |
| 6,460,112 B1 * | 10/2002 | Srinivasan et al. | | 711/108 |
| 6,522,562 B2 * | 2/2003 | Foss | | 365/49.1 |
| 6,567,286 B2 * | 5/2003 | Yanagawa | | 365/49.12 |
| 6,574,702 B2 * | 6/2003 | Khanna et al. | | 711/108 |
| 6,658,458 B1 * | 12/2003 | Gai et al. | | 709/215 |
| 6,731,526 B2 * | 5/2004 | Inoue | | 365/49.17 |
| 6,795,325 B1 * | 9/2004 | Inoue | | 365/49.17 |
| 6,825,706 B2 * | 11/2004 | Kumar et al. | | 327/407 |
| 6,874,016 B1 * | 3/2005 | Gai et al. | | 709/215 |
| 6,965,519 B1 * | 11/2005 | Park et al. | | 365/49.17 |
| 7,006,368 B2 * | 2/2006 | Arsovski et al. | | 365/49.17 |
| 7,120,040 B2 * | 10/2006 | Perry et al. | | 365/49.11 |
| 7,158,403 B2 * | 1/2007 | Schmitt | | 365/154 |
| 7,167,385 B2 * | 1/2007 | Chan et al. | | 365/49.12 |
| 7,203,081 B2 * | 4/2007 | Nishiyama et al. | | 365/49.17 |
| 7,243,290 B2 * | 7/2007 | Slavin | | 714/763 |
| 7,469,369 B2 * | 12/2008 | Matsuoka et al. | | 714/718 |
| 7,515,449 B2 * | 4/2009 | Arsovski et al. | | 365/49.1 |
| 7,610,269 B1 * | 10/2009 | Gupta et al. | | 1/1 |
| 7,667,993 B2 * | 2/2010 | Wang et al. | | 365/49.17 |

* cited by examiner

*Primary Examiner* — Viet Q Nguyen
(74) *Attorney, Agent, or Firm* — Dawn V. Stephens; Wade James Brady, III; Frederick J. Telecky, Jr.

(57) ABSTRACT

A scheme for bit cell designs for ternary content addressable memory for comparing search data with content data is disclosed. In one embodiment, a system for comparing search data with content data stored in a ternary content addressable memory (TCAM) unit, includes a first static logic gate for comparing a first content data with a first search data, and a second static logic gate coupled to the first static logic gate for comparing a second content data with a second search data. The content data comprises the first content data and the second content data and the search data comprises the first search data and the second search data. The first static logic gate forwards a signal for disabling the second static logic gate if the first content data does not match with the first search data.

15 Claims, 10 Drawing Sheets

| STATE (402) | CONTENT BIT 1 (222) | CONTENT BIT 2 (226) | SEARCH BIT 1 (348) | SEARCH BIT 2 (350) | RESULT (356) |
|---|---|---|---|---|---|
| 0 | 1 | 0 | 1 | 0 | HIT |
| 1 | 0 | 1 | 1 | 0 | MISS |
| X | 0 | 0 | 1 | 0 | HIT |
| INVALID | 1 | 1 | 1 | 0 | MISS |
| 0 | 1 | 0 | 0 | 1 | MISS |
| 1 | 0 | 1 | 0 | 1 | HIT |
| X | 0 | 0 | 0 | 1 | HIT |
| INVALID | 1 | 1 | 0 | 1 | MISS |
| 0 | 1 | 0 | 1 | 1 | HIT |
| 1 | 0 | 1 | 1 | 1 | HIT |
| X | 0 | 0 | 1 | 1 | HIT |
| INVALID | 1 | 1 | 1 | 1 | HIT |
| 0 | 1 | 0 | 0 | 0 | - |
| 1 | 0 | 1 | 0 | 0 | - |
| X | 0 | 0 | 0 | 0 | - |
| INVALID | 1 | 1 | 0 | 0 | - |

*FIG. 4A*

| STATE (452) | CONTENT BIT 3 (230) | CONTENT BIT 4 (234) | SEARCH BIT 3 (352) | SEARCH BIT 4 (354) | RESULT (358) |
|---|---|---|---|---|---|
| 0 | 1 | 0 | 0 | 1 | HIT |
| 1 | 0 | 1 | 0 | 1 | MISS |
| X | 0 | 0 | 0 | 1 | HIT |
| INVALID | 1 | 1 | 0 | 1 | MISS |
| 0 | 1 | 0 | 1 | 0 | MISS |
| 1 | 0 | 1 | 1 | 0 | HIT |
| X | 0 | 0 | 1 | 0 | HIT |
| INVALID | 1 | 1 | 1 | 0 | MISS |
| 0 | 1 | 0 | 0 | 0 | HIT |
| 1 | 0 | 1 | 0 | 0 | HIT |
| X | 0 | 0 | 0 | 0 | HIT |
| INVALID | 1 | 1 | 0 | 0 | HIT |
| 0 | 1 | 0 | 1 | 1 | - |
| 1 | 0 | 1 | 1 | 1 | - |
| X | 0 | 0 | 1 | 1 | - |
| INVALID | 1 | 1 | 1 | 1 | - |

*FIG. 4B*

| STATE (602) | CONTENT BIT 1 (222) | CONTENT BIT 2 (226) | SEARCH BIT 1 (548) | SEARCH BIT 2 (550) | RESULT (556) |
|---|---|---|---|---|---|
| 0 | 1 | 0 | 0 | 1 | HIT |
| 1 | 0 | 1 | 0 | 1 | MISS |
| X | 0 | 0 | 0 | 1 | HIT |
| INVALID | 1 | 1 | 0 | 1 | MISS |
| 0 | 1 | 0 | 1 | 0 | MISS |
| 1 | 0 | 1 | 1 | 0 | HIT |
| X | 0 | 0 | 1 | 0 | HIT |
| INVALID | 1 | 1 | 1 | 0 | MISS |
| 0 | 1 | 0 | 0 | 0 | HIT |
| 1 | 0 | 1 | 0 | 0 | HIT |
| X | 0 | 0 | 0 | 0 | HIT |
| INVALID | 1 | 1 | 0 | 0 | HIT |
| 0 | 1 | 0 | 1 | 1 | - |
| 1 | 0 | 1 | 1 | 1 | - |
| X | 0 | 0 | 1 | 1 | - |
| INVALID | 1 | 1 | 1 | 1 | - |

*FIG. 6A*

| STATE (652) | CONTENT BIT 3 (230) | CONTENT BIT 4 (234) | SEARCH BIT 3 (552) | SEARCH BIT 4 (554) | RESULT (558) |
|---|---|---|---|---|---|
| 0 | 1 | 0 | 1 | 0 | HIT |
| 1 | 0 | 1 | 1 | 0 | MISS |
| X | 0 | 0 | 1 | 0 | HIT |
| INVALID | 1 | 1 | 1 | 0 | MISS |
| 0 | 1 | 0 | 0 | 1 | MISS |
| 1 | 0 | 1 | 0 | 1 | HIT |
| X | 0 | 0 | 0 | 1 | HIT |
| INVALID | 1 | 1 | 0 | 1 | MISS |
| 0 | 1 | 0 | 1 | 1 | HIT |
| 1 | 0 | 1 | 1 | 1 | HIT |
| X | 0 | 0 | 1 | 1 | HIT |
| INVALID | 1 | 1 | 1 | 1 | HIT |
| 0 | 1 | 0 | 0 | 0 | - |
| 1 | 0 | 1 | 0 | 0 | - |
| X | 0 | 0 | 0 | 0 | - |
| INVALID | 1 | 1 | 0 | 0 | - |

*FIG. 6B*

BIT CELL DESIGNS FOR TERNARY CONTENT ADDRESSABLE MEMORY

RELATED APPLICATIONS

Co-pending patent application titled "CONTENT ADDRESSABLE MEMORY BASED ON A RIPPLE SEARCH SCHEME", application Ser. No. 12/124,149 filed on May 21, 2008 is herein incorporated by reference in its entirety for all purposes.

FIELD OF TECHNOLOGY

Embodiments of the present invention relate to the field of electronics. More particularly, embodiments of the present invention relate to measurement systems, devices and circuits for content addressable memory.

BACKGROUND

A content addressable memory (CAM) is a hardware search engine made of memory and comparison circuitry. The CAM compares input search data against stored content data using the comparison circuitry, and returns the address or addresses of matching content data in a single clock cycle.

In a basic architecture of the CAM, search lines are used to forward the search data to core cells of the CAM, which includes both the memory and comparison circuitry. In addition, match lines are used to indicate whether the search data matches its corresponding content data, where the match lines are pre-charged high at the start of the CAM operation. When the search data is compared with the content data, cells with a mismatch or miss pulls down their respective match lines, whereas cells with a match or hit stay on.

The comparison circuitry, which is required for every cell in the memory, increases physical size of the CAM which in turn increases manufacturing cost of the CAM. In addition, the comparison circuitry also increases power dissipation since it is active on every clock cycle, and the match lines have to be pre-charged high before the matching operation. Furthermore, a high peak current in design of the CAM to accommodate the high power dissipation may result in a high dynamic voltage drop of the CAM's power supply. To counter the voltage drop, a significant amount of decoupling capacitance (de-cap) has to be provided to the CAM. The area overhead for such a remedy (e.g., implementation of de-cap transistors) may require an additional area overhead in the CAM.

SUMMARY

A scheme for bit cell designs for ternary content addressable memory is disclosed. In one aspect, a system for comparing search data with content data stored in a ternary content addressable memory (TCAM) unit, includes a first static logic gate for comparing a first content data with a first search data, and a second static logic gate coupled to the first static logic gate for comparing a second content data with a second search data. The content data includes the first content data and the second content data and the search data includes the first search data and the second search data. The first static logic gate forwards a signal for disabling the second static logic gate if the first content data does not match with the first search data.

In another aspect, a system for ternary content addressable memory (TCAM), includes a chain of TCAM units for storing content word and comparing the content word with search word, with each CAM unit including a storage unit for storing content data and a match module for comparing the content data with respective search data. The storage unit further includes a first storage unit of the storage unit for storing a first content data, and a second storage unit of the storage unit for storing a second content data. The match module further includes a first static logic gate for comparing the first content data with a first search data, and a second static logic gate coupled to the first static logic gate for comparing the second content data with a second search data. For example, the content data includes the first content data and the second content data, and the search data includes the first search data and the second search data. Also, the content data is a portion of the content word and the search data is a portion of the search word. In addition, the first static logic gate forwards a signal for disabling the second static logic gate if the first content data does not match with the first search data. In addition, comparing the content word with the search word is performed sequentially from one end of the chain of CAM units to the other end of the chain of CAM units.

The systems and apparatuses disclosed herein may be implemented in any means for achieving various aspects, and other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which:

FIG. 4A is an exemplary logic table associated with a first static logic gate in the match module of FIG. 3, according to one embodiment.

FIG. 4B is an exemplary logic table associated with a second static logic gate in the match module of FIG. 3, according to one embodiment.

FIG. 6A is an exemplary logic table associated with a first static logic gate in the match module of FIG. 5, according to one embodiment.

FIG. 6B is an exemplary logic table associated with a second static logic gate in the match module of FIG. 5, according to one embodiment.

Other features of the present embodiments will be apparent from the accompanying drawings and from the detailed description that follows.

DETAILED DESCRIPTION

A scheme for bit cell designs for ternary content addressable memory is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
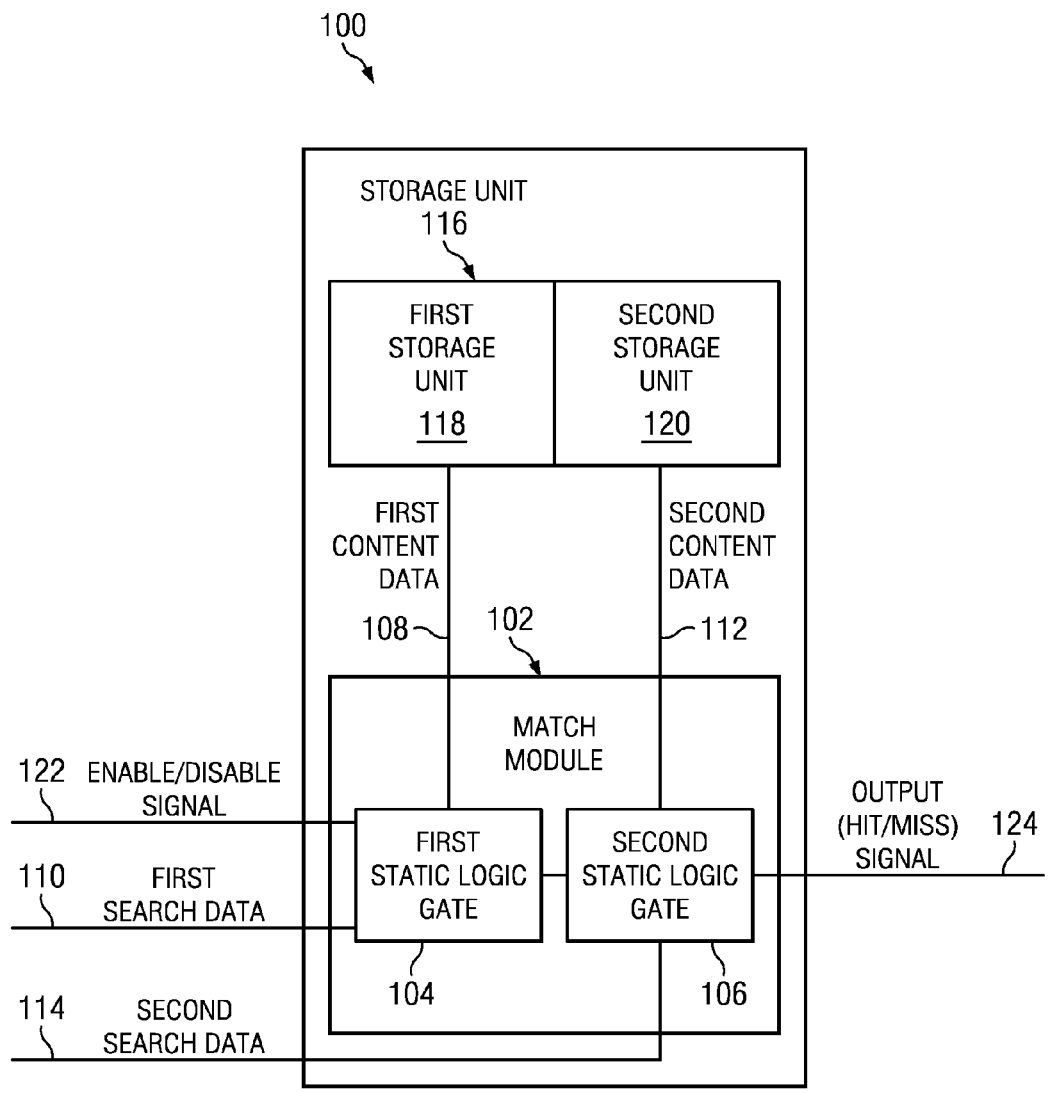
FIG. 1 is a block diagram for an exemplary ternary content addressable memory (TCAM) system, according to one embodiment.

FIG. 1 is a block diagram for an exemplary ternary content addressable memory (TCAM) system 100, according to one embodiment. Particularly, FIG. 1 illustrates a match module 102 and a storage unit 116. As shown in FIG. 1, the match module 102 includes a first static logic gate 104 and a second static logic gate 106. Also, the storage unit 116 includes a first storage unit 118 and a second storage unit 120.

In one embodiment, the TCAM system 100 compares search data with content data stored in a TCAM unit. In one example embodiment, the content data includes a first content data 108 and a second content data 112 and the search data includes a first search data 110 and a second search data 114. It is appreciated that the first static logic gate 104 compares the first content data 108 with the first search data 110, and the second static logic gate 106 coupled to the first static logic gate 104 compares the second content data 112 with the second search data 114. As shown in FIG. 1, the first static logic gate 104 and the second static logic gate 106 are coupled together in a manner, such that the second static logic gate 106 of the CAM system 100 generates an output (HIT or MISS) signal 124. The first storage unit 118 of the TCAM stores the first content data 108, and the second storage unit 120 of the TCAM stores the second content data 112.

In one exemplary implementation, the first static logic gate 104 compares the first content data 108 with the first search data 110 only if an enable signal 122 is received by the first static logic gate 104. Further, the first static logic gate 104 forwards a signal for disabling the second static logic gate 106 if the first content data 108 does not match with the first search data 110.

It is appreciated that both the first static logic gate 104 and the second static logic gate 106 should generate a hit (or match) as their outputs for the output signal 124 to forward a hit (or match). In addition, the second static logic gate 106 remains off if the first static logic gate 104 registers a miss (or mismatch). As a result, needless power dissipation by the second static logic gate 106 can be avoided. The storage unit 116 and the match module 102 are explained in detail while describing FIG. 2 and FIG. 3 respectively.

Figure 2:
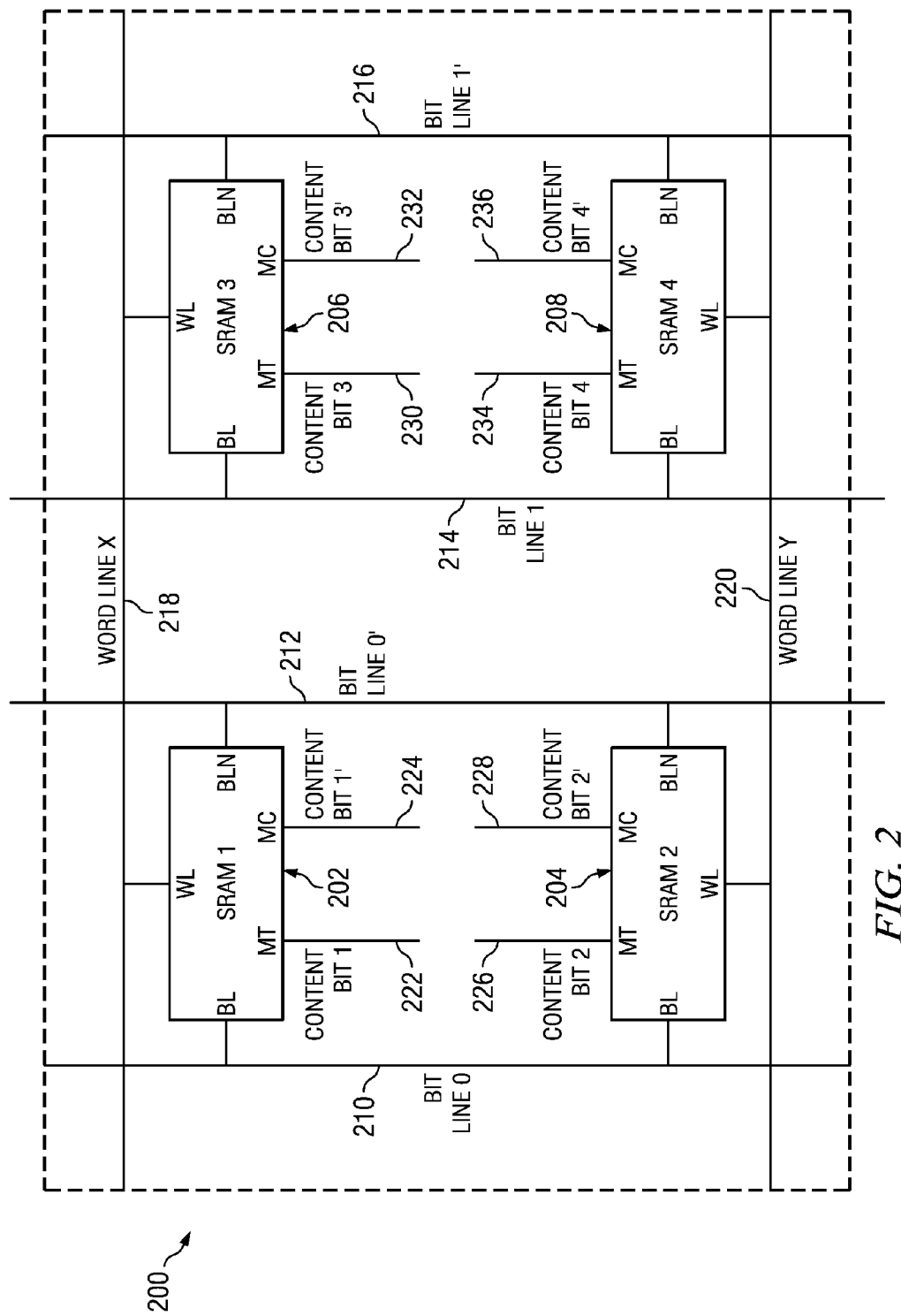
FIG. 2 is a block diagram for an exemplary storage unit of the TCAM in FIG. 1, according to one embodiment.

FIG. 2 is a block diagram for an exemplary storage unit 200 of the TCAM in FIG. 1, according to one embodiment. It is appreciated that the storage unit 200 is an exemplary embodiment of the storage unit 116 of FIG. 1. As shown in FIG. 2, each of the first storage unit 118 and the second storage unit 120 includes two six-transistor SRAM bit cells. For example, the first storage unit 118 includes SRAM 1 202 and SRAM 2 204, and the second storage unit 120 includes SRAM 3 206 and SRAM 4 208.

Each of the four SRAM bit cells (e.g., the SRAM 1 202, the SRAM 2 204, the SRAM 3 206, and the SRAM 4 208) stores the content bits (e.g., content bit 1 222, content bit 2 226, content bit 3 230 and content bit 4 234 respectively) or complementary content data bits (e.g., content bit 1' 224, content bit 2' 228, content bit 3' 232, and content bit 4' 236 respectively). Further, each one of the first content data 108 and the second content data 112 includes a state "0," a state "1," and a state "don't care".

As shown in FIG. 2, all SRAM bit cells in a column share the same bit line (e.g., the bit line 0 210, bit line 0' 212, bit line 1 214, and bit line 1' 216), whereas, all SRAM bit cells in a row share the same word line (e.g., word line X 218 and word line Y 220). It is appreciated that the four six-transistor SRAM bit cells store the content data at nodes (e.g., MTs and MCs). For example, the content bit 1 222, the content bit 2 226, the content bit 3 230 and the content bit 4 234 are stored in the MT nodes, and the complementary bits (e.g., the content bit 1' 224, the content bit 2' 228, the content bit 3' 232, and the content bit 4' 236) are stored in the MC nodes.

Figure 3A:
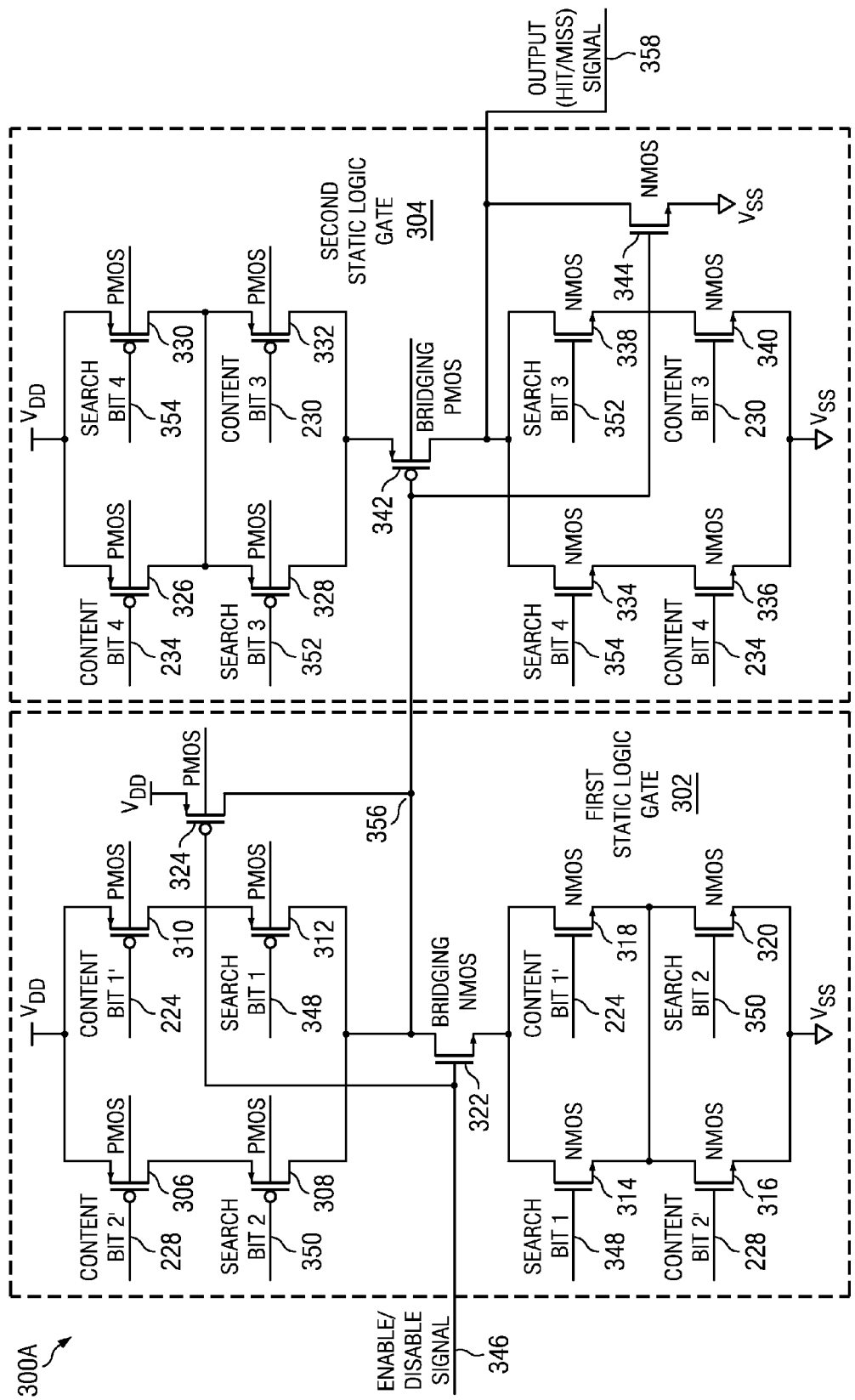
FIG. 3A is a block diagram for an exemplary match module of the TCAM in FIG. 1, according to one embodiment.

FIG. 3A is a block diagram for an exemplary match module 300A of the TCAM in FIG. 1, according to one embodiment. It is appreciated that the match module 300A is an exemplary embodiment of the match module 102 of FIG. 1. It is also appreciated that the match module 300A is associated with the storage unit 200 of FIG. 2. In one embodiment, the match module 300A includes a first static logic gate 302 and a second static logic gate 304.

As shown in FIG. 3A, the first static logic gate 302 of the TCAM includes two parallel paths of two pmos transistors in series (i.e., (pmos 306 in series with pmos 308) in parallel with (pmos 310 in series with pmos 312)) serially coupled with two parallel paths of two nmos transistors in series (i.e., (nmos 314 in series with nmos 316) in parallel with (nmos 318 in series with nmos 320)) via the bridging nmos transistor 322. Also, source nodes of two respective ones of the pmos transistors (i.e., the pmos 306 and the pmos 310) are connected to a positive power supply $V_{DD}$, and source nodes of two respective ones of the nmos transistors (i.e., the nmos 316 and the nmos 320) are connected to a negative power supply $V_{SS}$. Also, the source node of the nmos 314 is connected to the source node of the nmos 318.

In addition, the first static logic gate 302 further includes an additional pmos transistor 324 with a source node of the additional pmos transistor 324 connected to the positive power supply $V_{DD}$, a drain node of the additional pmos transistor 324 connected to a drain node of the bridging nmos transistor 322, and a gate node of the additional pmos transistor 324 connected to a gate node of the bridging nmos transistor 322.

Similar to the first static logic gate 302, the second static logic gate 304 of the TCAM includes two parallel paths of two pmos transistors in series (i.e., (pmos 326 in series with pmos 328) in parallel with (pmos 330 in series with 332)) serially coupled with two parallel paths of two nmos transistors in series (i.e., (nmos 334 in series with nmos 336) in parallel with (nmos 338 in series with nmos 340)) via the bridging pmos transistor 342. Further as shown in FIG. 3A, source nodes of two respective ones of the pmos transistors (i.e., the pmos 326 and the pmos 330) are connected to a positive power supply $V_{DD}$, and source nodes of two respective ones of the nmos transistors (i.e., the nmos 336 and the nmos 340) are connected to a negative power supply $V_{SS}$. Also, the drain node of the pmos 326 is connected to the drain node of the pmos 330.

In addition, the second static logic gate 304 further includes an additional nmos transistor 344 with a source node of the nmos transistor 344 connected to the negative power supply $V_{SS}$, a drain node of the nmos transistor 344 connected to a drain node of the bridging pmos transistor 342, and a gate node of the nmos transistor 344 connected to a gate node of the bridging pmos transistor 342.

In one embodiment, the drain of the bridging nmos 322 is an output node 356 of the first static logic gate 302, and the drain of the bridging pmos 342 is an output node of the second static logic gate 304. In operation, the first static logic gate 302 is enabled by an enable signal 346 to the bridging nmos transistor 322. In one exemplary implementation, the first static logic gate 302 is operable only if the bridging nmos 322 is turned on by a high logic signal 346 from the positive power supply $V_{DD}$ or a previous match module. It is appreciated that the output node 356 of the first static logic gate 302 is at logical low if the first content data (e.g., which is determined by the content bit 1 222, the content bit 2 226 and/or their complements) matches with the first search data (e.g., which is determined by a search bit 1 348 and a search bit 2 350).

Further, the second static logic gate 304 is enabled by an enable signal to a bridging pmos transistor 342. In one exemplary implementation, the second static logic gate 304 is operable only if the bridging pmos 342 is turned on by a low logic signal forwarded by the first static logic gate 302. It is appreciated that the output node (e.g., at output signal 358) of the second static logic gate 304 is at a logical high if the second content data (e.g., which is determined by the content bit 3 230, the content bit 4 234 and/or their complements) matches with the second search data (e.g., which is determined by a search bit 3 352 and a search bit 4 354).

In the example embodiment illustrated in FIG. 3A, the first static logic gate 302 is connected in series with the second static logic gate 304 such that the second static logic gate 304 is driven by the output of the first static logic gate 302. In one exemplary implementation, if the first static logic gate 302 senses a hit (i.e., the portion of content data matches with the respective portion of the search data), one of the series nmos path (e.g., a path formed by the nmos 314 and 316 or a path formed by the nmos 318 and 320) turns on and pulls the output (e.g., at output node 356) of the first static logic gate 302 to low.

In other words, if the first static logic gate 302 senses a miss, one of the series pmos path (e.g., a path formed by the pmos 306 and 308 or a path formed by the pmos 310 and 312) turns on and the output of the first static logic gate 302 is kept high. In case of the first static logic gate 302 senses a miss, the output signal 358 of the second static logic gate 304 stays low.

Further, the second static logic gate 304 is enabled only if the first static logic gate 302 senses a hit and generates low output at the output node 356 of the first static logic gate 302. In case the second static logic gate 304 senses a hit, one of the series pmos path (e.g., a path formed by the pmos 326 and 328 or a path formed by the pmos 330 and 332) turns on and pulls the output of the second static logic gate 304 to high. In case the second static logic gate 304 senses a miss, the output of the second static logic gate 304 is kept low by one of the series nmos path (e.g., a path formed by the nmos 334 and 336 or a path formed by the nmos 338 and 340).

Figure 3B:
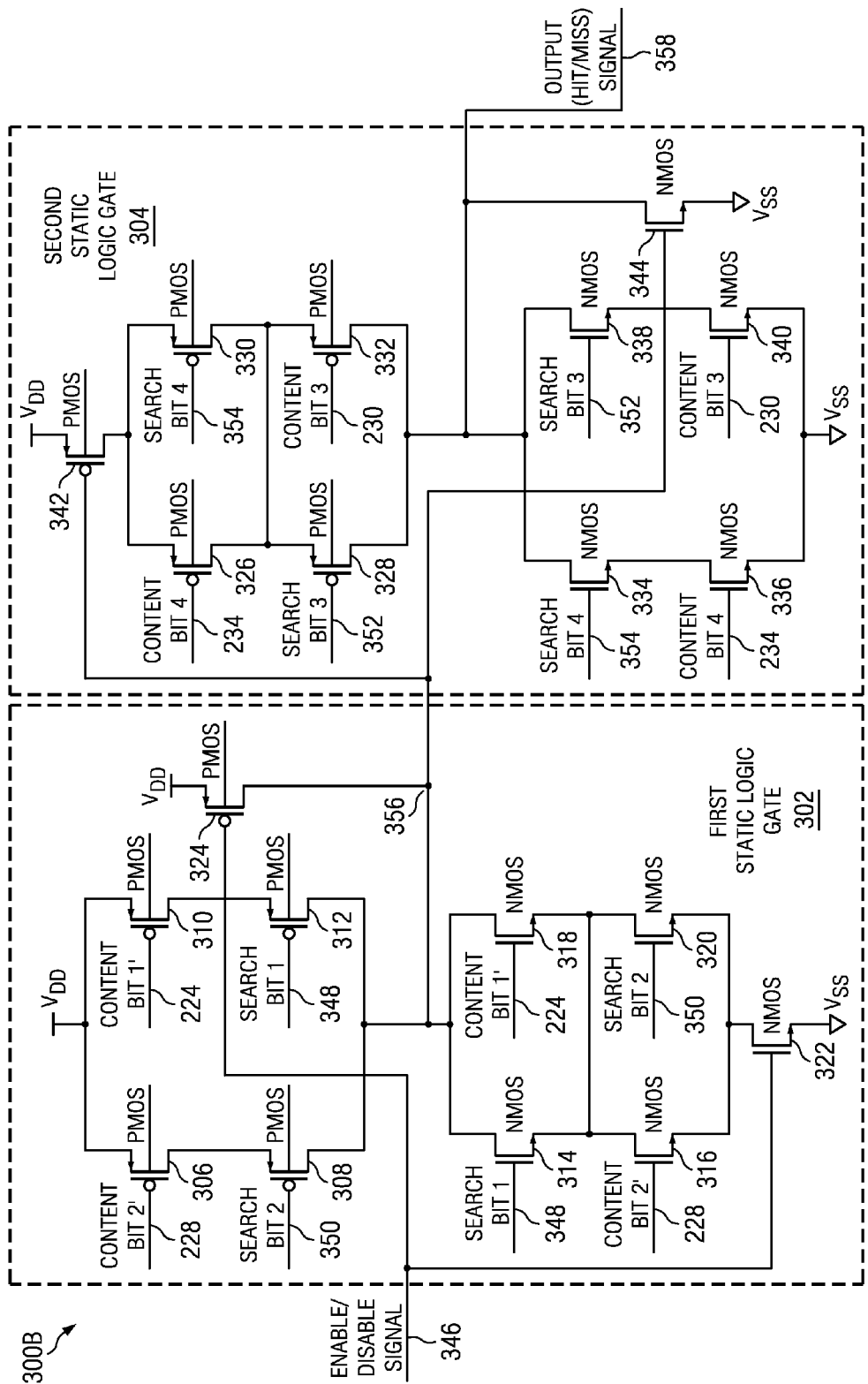
FIG. 3B is a block diagram for another exemplary match module of the TCAM in FIG. 1, according to one embodiment.

FIG. 3B is a block diagram for another exemplary match module 300B of the TCAM in FIG. 1, according to one embodiment. Particularly, the circuit connections of FIG. 3B are similar to the circuit connections of FIG. 3A except for the NMOS 322 and the PMOS 342.

As illustrated in first static logic gate 302 of FIG. 3B, source nodes of two respective ones of the nmos transistors (i.e., the nmos 316 and the nmos 320) are connected to a drain node of the nmos transistor 322. Further, source node of nmos transistor 322 is connected to a negative power supply $V_{SS}$. In addition, the gate node of the nmos transistor 322 is connected to the gate node of the pmos transistor 324. In one example embodiment, the drain nodes of the pmos transistor 308 and pmos transistor 312 are directly connected to the drain nodes of the nmos transistor 314 and the nmos transistor 318. In one embodiment, the output node 356 of the first static logic gate 302 is coupled to the drain nodes of respective transistors as shown in FIG. 3B.

Further as illustrated in second static logic gate 304 of FIG. 3B, source nodes of two respective ones of the pmos transistors (i.e., the pmos 326 and the pmos 330) are connected to a drain node of the pmos transistor 342. Further, source node of the pmos transistor 342 is connected to a positive power supply $V_{DD}$. In addition, the gate node of the pmos transistor 342 is connected to the gate node of the nmos transistor 344. In one example embodiment, the drain nodes of the pmos transistor 328 and pmos transistor 332 are directly connected to the drain nodes of the nmos transistor 334 and the nmos transistor 338. In one embodiment, the output node 358 of the second static logic gate 304 is coupled to the drain nodes of respective transistors as shown in FIG. 3B.

In operation, the first static logic gate 302 is enabled by an enable signal 346 to the nmos transistor 322. Further, the second static logic gate 304 is enabled by an enable signal to the pmos transistor 342. It is appreciated that the operational aspects associated with FIG. 3B are similar to the operational aspects associated with FIG. 3A. Further, the outputs of the first static logic gate 302 and the second static logic gate 304 (e.g., associated with FIG. 3A and FIG. 3B) are explained using the FIG. 4A and FIG. 4B respectively.

FIG. 4A is an exemplary logic table 400A associated with the first static logic gate 302 in the match module 300A of FIG. 3A or 300B of FIG. 3B, according to one embodiment. Particularly, FIG. 4A illustrates the output (e.g., HIT or MISS) signal generated by the first static logic gate 302 for different combinations of content bits and search bits.

A state 402 refers to three valid states 0, 1, don't care (X), and one invalid state stored by a ternary CAM (TCAM) storage unit. It is appreciated that two SRAM bit cells (e.g., the content bit 1 222 and the content bit 2 226) are needed to form one of the three available states. In one example embodiment, the output of the first static logic gate 302 results in a hit only if at least one of the following conditions is satisfied:

The content bit 1 222=0 and the content bit 2 226=0 form a don't care (X) state.

The search bit 1 348=1 and the search bit 2 350=1 form a don't care (X) state.

The portion of the content data (e.g., the content bit 1 222 and the content bit 2 226) matches with the respective portion of the search data (e.g., the search bit 1 348 and the search bit 2 350 respectively).

As explained in FIG. 3A and FIG. 3B, if the first static logic gate 302 senses a hit, one of the series nmos path turns on and pulls the output of the first static logic gate 302 to low, else one of the series pmos path turns on and the output of the first static logic gate 302 is kept high. The CAM is designed in such a manner, that the search operation for the combination of search bit 1 348=0 and the search bit 2 350=0 is not possible as illustrated in FIG. 4A.

FIG. 4B is an exemplary logic table 400B associated with the second static logic gate 304 in the match module 300A of FIG. 3A or 300B of FIG. 3B, according to one embodiment. Particularly, FIG. 4B illustrates the output (e.g., HIT or MISS) signal 358 generated by the second static logic gate 304 for different combinations of content bits and search bits.

In one example embodiment, the output of the second static logic gate 304 results in a hit only if at least one of the following conditions is satisfied:

The content bit 3 230=0 and the content bit 4 234=0 form a don't care (X) state.

The search bit 3 352=0 and the search bit 4 354=0 form a don't care (X) state.

The portion of the content data (e.g., the content bit 3 230 and the content bit 4 234) matches with complements of the respective portion of the search data (e.g., the search bit 3 352 and the search bit 4 354 respectively).

As explained in FIG. 3A and FIG. 3B, if the second static logic gate 304 senses a hit, one of the series pmos path turns on and pulls the output of the second static logic gate 304 high, otherwise one of the series nmos path turns on and the output of the second static logic gate 304 is kept low. The CAM is designed in such a manner, that the search operation for the combination of search bit 3 352=1 and the search bit 4 354=1 is not possible as illustrated in FIG. 4B.

Figure 5:
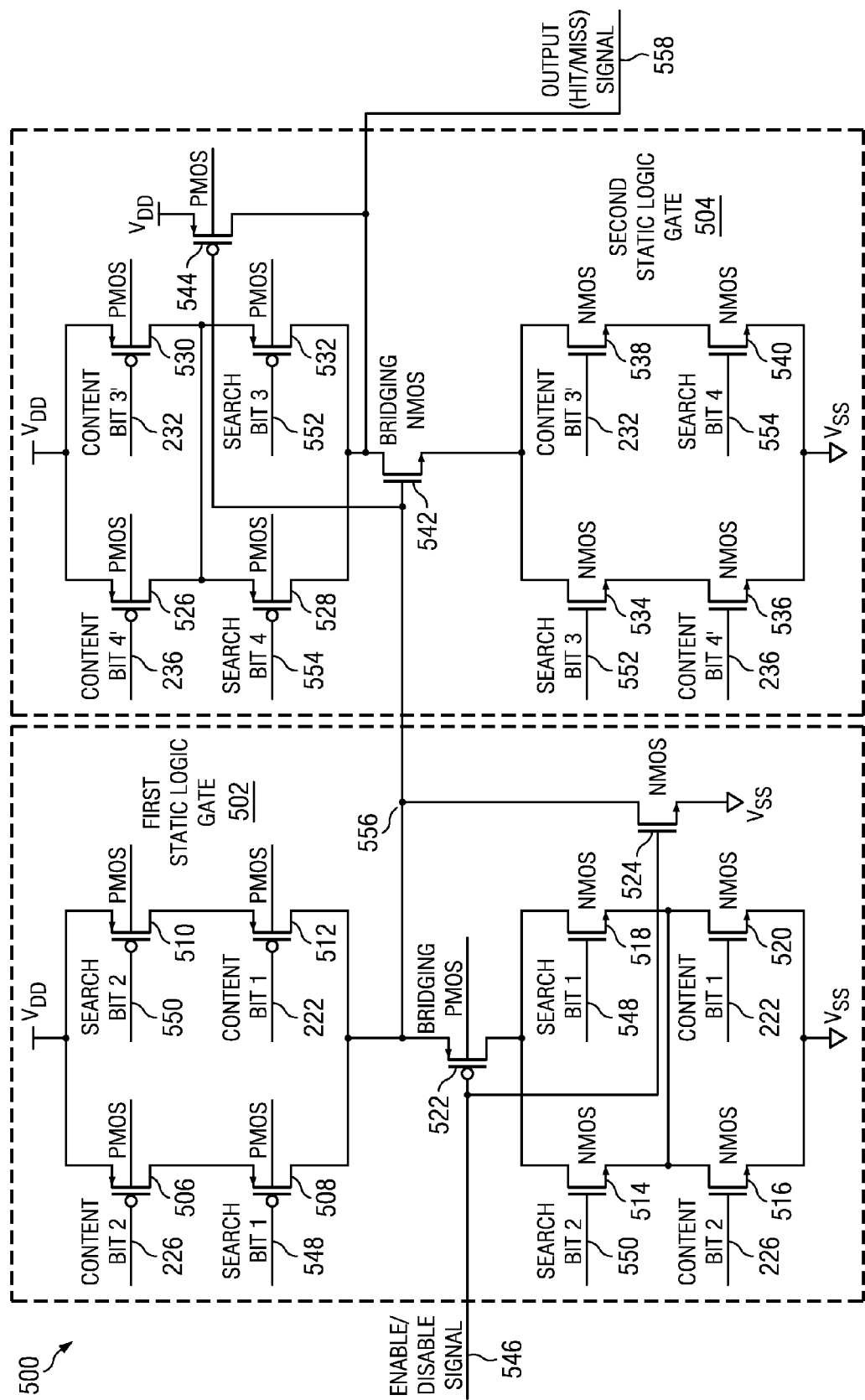
FIG. 5 is a block diagram for an exemplary match module of the TCAM in FIG. 1, according to one embodiment.

FIG. 5 is a block diagram for an exemplary match module 500 of the TCAM in FIG. 1, according to one embodiment. In one embodiment, the match module 500 includes a first static logic gate 502 and a second static logic gate 504. As shown in FIG. 5, the first static logic gate 502 of the TCAM includes two parallel paths of two pmos transistors in series (i.e., (pmos 506 in series with pmos 508) in parallel with (pmos 510 in series with pmos 512)) serially coupled with two parallel paths of two nmos transistors in series (i.e., (nmos 514 in series with nmos 516) in parallel with (nmos 518 in series with nmos 520)) via the bridging pmos transistor 522.

Further as shown in FIG. 5, source nodes of two respective ones of the pmos transistors (i.e., the pmos 506 and the pmos 510) are connected to a positive power supply $V_{DD}$, and source nodes of two respective ones of the nmos transistors (i.e., the nmos 516 and the nmos 520) are connected to a negative power supply $V_{SS}$. In addition, the first static logic gate 502 further includes an additional nmos transistor 524 with a source node of the additional nmos transistor 524 connected to the negative power supply $V_{SS}$, a drain node of the additional nmos transistor 524 connected to a drain node of the bridging pmos transistor 522, and a gate node of the additional nmos transistor 524 connected to a gate node of the bridging pmos transistor 522. Also, the source node of the nmos 514 is connected to the source node of the nmos 518.

Similar to the first static logic gate 502, the second static logic gate 504 of the TCAM includes two parallel paths of two pmos transistors in series (i.e., (pmos 526 in series with pmos 528) in parallel with (pmos 530 in series with 532)) serially coupled with two parallel paths of two nmos transistors in series (i.e., (nmos 534 in series with nmos 536) in parallel with (nmos 538 in series with nmos 540) via a bridging nmos transistor 542.

Further as shown in FIG. 5, source nodes of two respective ones of the pmos transistors (i.e., the pmos 526 and the pmos 530) are connected to a positive power supply $V_{DD}$, and source nodes of two respective ones of the nmos transistors (i.e., the nmos 536 and the nmos 540) are connected to a negative power supply $V_{SS}$. In addition, the second static logic gate 504 further includes an additional pmos transistor 544 with a source node of the additional pmos transistor 544 connected to the positive power supply $V_{DD}$, a drain node of the additional pmos transistor 544 connected to a drain node of the bridging nmos transistor 542, and a gate node of the pmos transistor 544 connected to a gate node of the bridging nmos transistor 542. Also, the drain node of the pmos 526 is connected to the drain node of the pmos 530.

In one embodiment, the drain of the bridging pmos 522 is an output node 556 of the first static logic gate 502, and the output node of the first static logic gate 502 is at logical high if the first content data (e.g., which is determined by the content bit 1 222, the content bit 2 226 and their complements) matches with the first search data (e.g., which is determined by the search bit 1 548 and the search bit 2 550). In one exemplary implementation, the first static logic gate 502 is enabled by an enable signal 546 to bridging pmos transistor 522. In one embodiment, the first static logic gate 502 is operable only if the bridging pmos 522 is turned on by a low logic signal from the negative power supply $V_{SS}$ or a previous match module.

Further, a drain of the bridging nmos 542 is an output node (e.g., the output signal 558) of the second static logic gate 504, and the output node of the second static logic gate 504 is at logical low if the second content data (e.g., which is determined by the content bit 3 230, the content bit 4 234, and their complements) matches with the second search data (e.g., the search bit 3 552 and the search bit 4 554 respectively). In one exemplary implementation, the second static logic gate 504 is enabled by an enable signal to a bridging nmos transistor 542. In one embodiment, the second static logic gate 504 is operable only if the bridging nmos 542 is turned on by a high logic signal forwarded by the first static logic gate 502.

In the example embodiment illustrated in FIG. 5, the first static logic gate 502 is connected in series with the second static logic gate 504 such that the second static logic gate 504 is driven by the output of the first static logic gate 502. In one exemplary implementation, if the first static logic gate 502 senses a hit (i.e., the first content data matches with the first search data), one of the series pmos path (e.g., a path formed by the pmos 506 and 508 or a path formed by the pmos 510 and 512) turns on and pulls the output (e.g., at output node 556) of the first static logic gate 502 to high.

In other words, if the first static logic gate 502 senses a miss, one of the series nmos path (e.g., a path formed by the nmos 514 and 516 or a path formed by the nmos 518 and 520) turns on and the output of the first static logic gate 502 is kept low. In case the first static logic gate 502 senses a miss the output signal 558 of the second static logic gate 504 stays high.

Further, the second static logic gate 504 is enabled only if the first static logic gate 502 senses a hit and generates high output at the output node 556 of the first static logic gate 502. In case the second static logic gate 504 senses a hit, one of the series nmos path (e.g., a path formed by the nmos 534 and 536 or a path formed by the nmos 538 and 540) turns on and pulls the output of the second static logic gate 504 to low. In case the second static logic gate 504 senses a miss, the output of the second static logic gate 504 is kept high by one of the series pmos path (e.g., a path formed by the pmos 526 and 528 or a path formed by the pmos 530 and 532).

FIG. 6A is an exemplary logic table 600A associated with the first static logic gate 502 in the match module 500 of FIG. 5, according to one embodiment. Particularly, FIG. 6A illustrates the output signal (e.g., HIT or MISS at output node 556) generated by the first static logic gate 502 for different combinations of the content bit 1 222, the content bit 2 226, the search bit 1 548 and the search bit 2 550.

A state 602 refers to three valid states 0, 1, don't care (X), and one invalid state stored by a ternary CAM (TCAM) storage unit. In one example embodiment, the output of the first static logic gate 502 results in a hit only if at least one of the following conditions is satisfied:

The content bit 1 222=0 and the content bit 2 226=0 form a don't care (X) state.

The search bit 1 548=0 and the search bit 2 550=0 form a don't care (X) state.

The content bit 1 222 and the content bit 2 226 matches with complements of the respective search bits (e.g., the search bit 1 548 and the search bit 2 550 respectively).

The CAM is designed in such a manner, that the search operation for the combination of search bit 1 548=1 and the search bit 2 550=1 is not possible as illustrated in FIG. 6A.

FIG. 6B is an exemplary logic table 600B associated with the second static logic gate 504 in the match module 500 of FIG. 5, according to one embodiment. Particularly, FIG. 6B illustrates the output (e.g., HIT or MISS) signal 558 generated by the second static logic gate 504 for different combinations of the content bit 3 230, the content bit 4 234, the search bit 3 552, and the search bit 4 554.

In one example embodiment, the output of the second static logic gate 504 results in a hit only if at least one of the following conditions is satisfied:

The content bit 3 230=0 and the content bit 4 234=0 form a don't care (X) state.

The search bit 3 552=1 and the search bit 4 554=1 form a don't care (X) state.

The content bit 3 230 and the content bit 4 234 matches with the respective search bits (e.g., the search bit 3 552 and the search bit 4 554 respectively).

The CAM is designed in such a manner, that the search operation for the combination of search bit 3 552=0 and the search bit 4 554=0 is not possible as illustrated in FIG. 6B.

Figure 7:
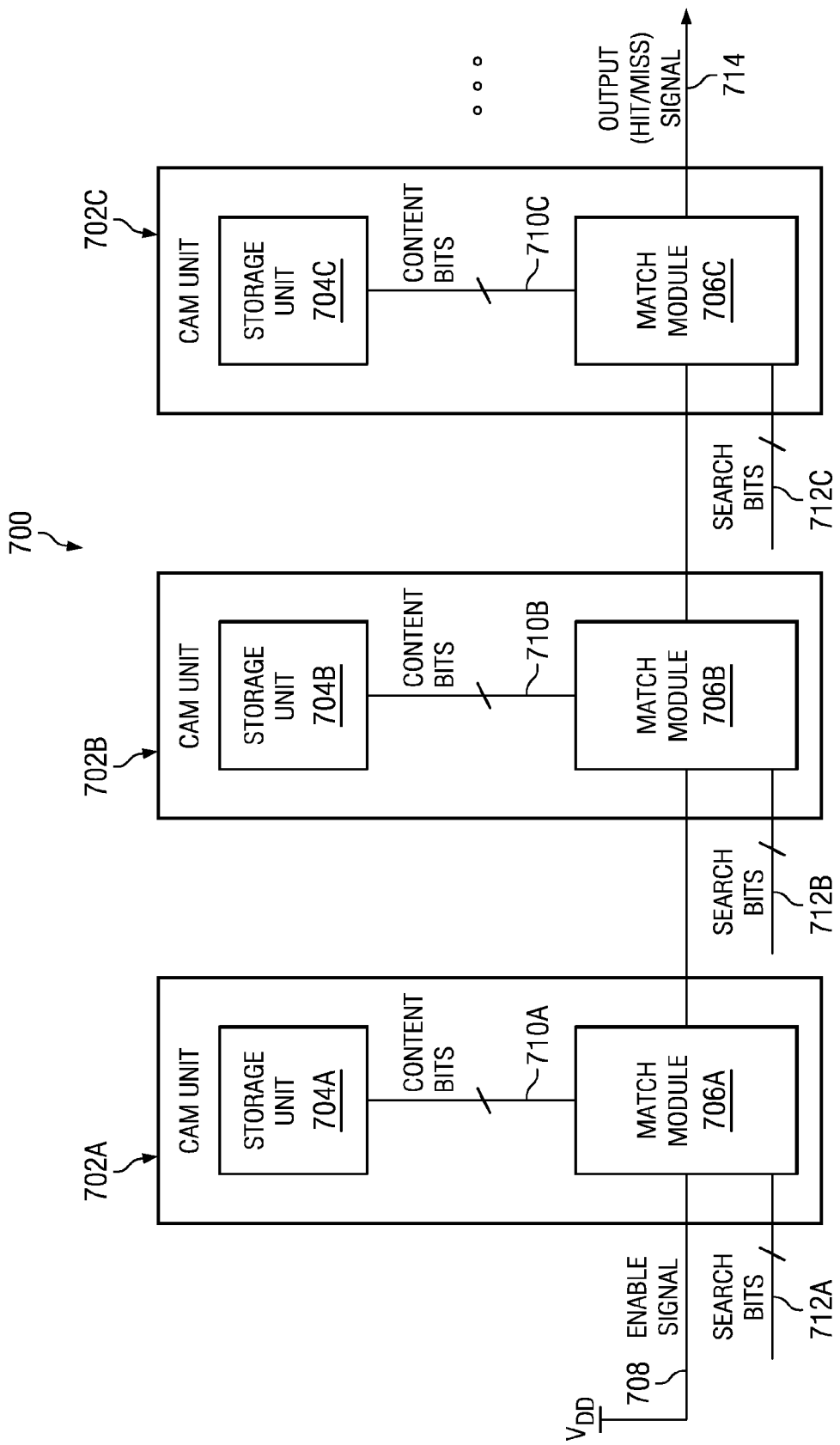
FIG. 7 is a block diagram for an exemplary TCAM system based on a chain of TCAM units, according to one embodiment.

FIG. 7 is a block diagram for an exemplary TCAM system 700 based on a chain of TCAM units 702A-C, according to one embodiment. It is appreciated that CAM units 702A-C may collectively or individually be referred to as CAM units 702 or CAM unit 702. Storage units 704A-C may collectively or individually be referred to as storage units 704 or storage unit 704. Also, match modules 706A-C may collectively or individually be referred to as match modules 706 or match module 706. Particularly, FIG. 7 illustrates the chain of TCAM units 702A-C for storing content word (e.g., content bits 710A-C) and comparing the content word with search word (e.g., search bits 712A-C).

In one example embodiment, each CAM unit 702 includes a storage unit 704 for storing content data (e.g., the content bit 710). For example, a first storage unit of the storage units 704 stores a first content data. A second storage unit of the storage units 704 stores a second content data. Further, each CAM unit 702 includes a match module 706 for comparing the content data 710 with respective search data 712.

The match module further includes a first static logic gate for comparing the first content data 710 with a first search data. The match module also includes a second static logic gate coupled to the first static logic gate for comparing the second content data 710 with a second search data. For example, the content data 710 includes the first content data and the second content data and the search data 712 includes the first search data and the second search data.

Further, the first static logic gate forwards a signal for disabling the second static logic gate if the first content data does not match with the first search data. In one example embodiment, the content data is a portion of the content word and the search word is a portion of the search word. In one exemplary implementation, comparing the content word with the search word is performed sequentially from one end of the chain of CAM units 702A to the other end of the chain of CAM units 702C.

Further, the content data is compared with the search data in the match module 706 only if an enable signal 708 is received by the match module 706. It is appreciated that, the enable signal is forwarded by a power supply (e.g., $V_{DD}$) or a previous match module in the chain of CAM units 702, if there is a match between the content data and the respective search data in the previous match module 706. In the example embodiment illustrated in FIG. 7, the match module 706C generates an output (e.g., HIT or MISS) signal 714.

Figure 8A:
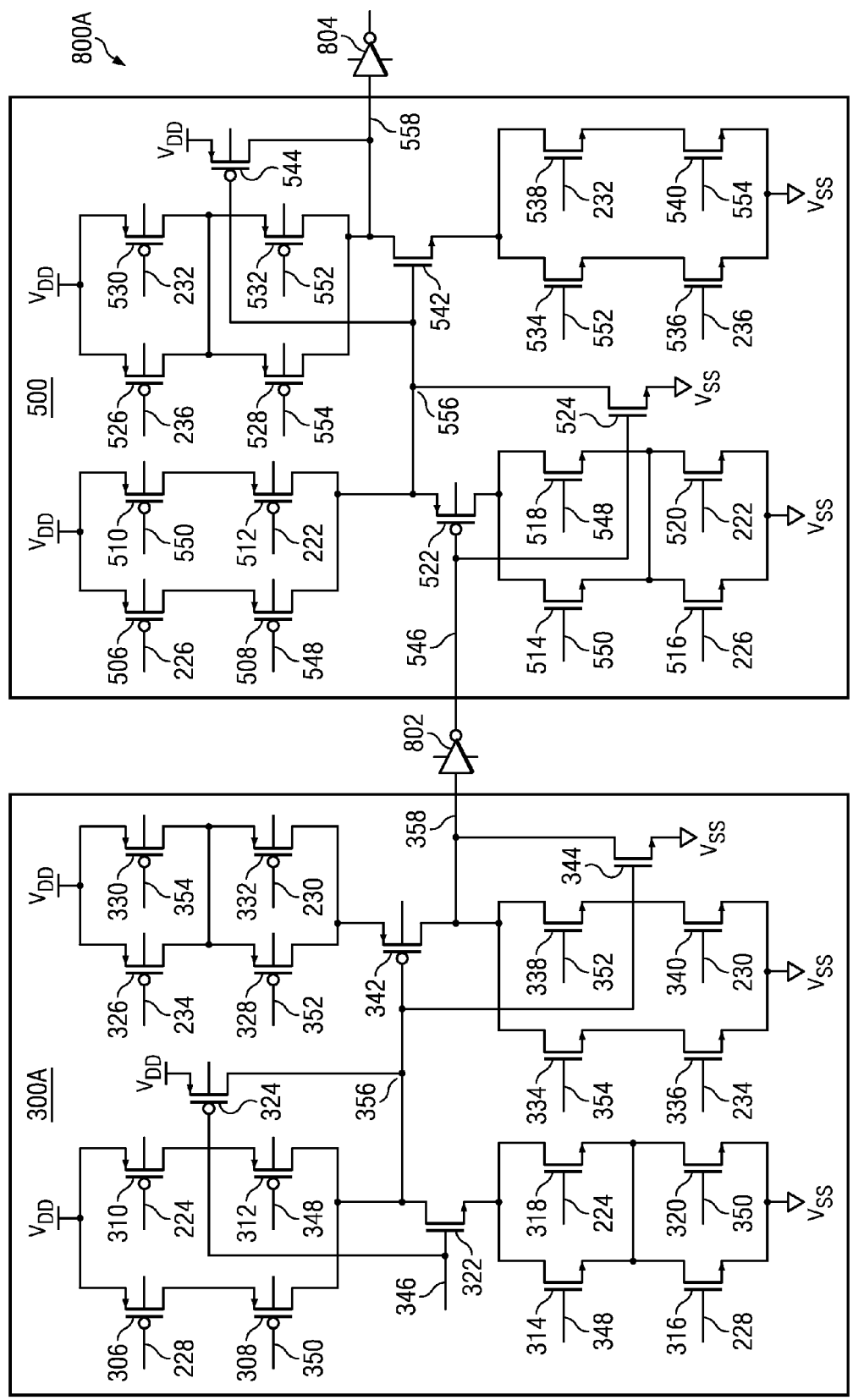
FIG. 8A is a block diagram for an exemplary chain of TCAM units constructed using the match module of FIG. 3A and the match module of FIG. 5, according to one embodiment.

FIG. 8A is a block diagram for an exemplary chain of TCAM units 800A constructed using the match module 300A of FIG. 3A and the match module 500 of FIG. 5, according to one embodiment. As shown in FIG. 8A, the match module 300A is connected in series with the match module 500 via an inverter 802. In one exemplary implementation, the match module 300A forwards an enable signal to the match module 500 via the inverter 802 only if the match module 300A senses a hit (e.g., if there is a match between the content data and the respective search data in the match module 300A). Similarly, the match module 500 generates a hit if the previous match module 300A senses a hit and if there is a match between the content data and the respective search data in the match module 500. An inverter 804 is coupled to the output of the match module 500 as shown in FIG. 8A.

Figure 8B:
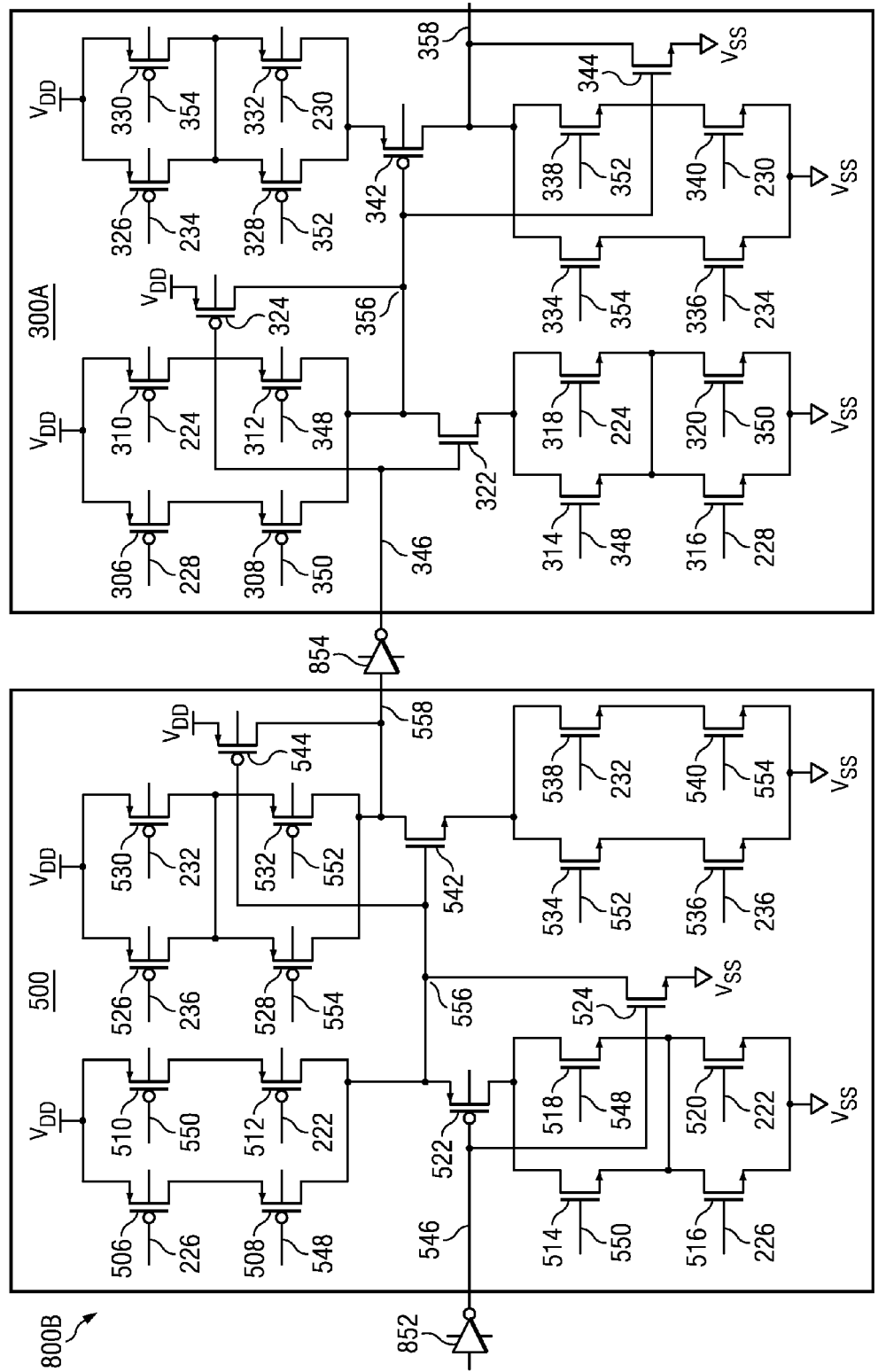
FIG. 8B is a block diagram for another exemplary chain of TCAM units constructed using the match module of FIG. 3A and the match module of FIG. 5, according to one embodiment.

FIG. 8B is a block diagram for another exemplary chain of TCAM units 800B constructed using the match module 300A of FIG. 3A and the match module 500 of FIG. 5, according to one embodiment. As shown in FIG. 8B, the match module 500 is connected in series with the match module 300A via an inverter 854. In one exemplary implementation, an input signal forwarded by the positive power supply or previous match module is sent to the match module 500 through an inverter 852. Further, the match module 500 forwards an enable signal to the match module 300A via the inverter 854 only if the match module 500 senses a hit (e.g., if there is a match between the content data and the respective search data in the match module 300A). Similarly, the match module 300A generates a hit if the previous match module 500 senses a hit and if there is a match between the content data and the respective search data in the match module 300A. It is appreciated that an exemplary TCAM chain can be constructed by serially connecting TCAM units with each TCAM unit having only the match module 300A in its static logic gates. It is also appreciated that an exemplary TCAM chain can be constructed by serially connecting TCAM units with each TCAM unit having only the match module 500 in its static logic gates.

Since the second static logic gate activates only when the first static logic gate senses a hit, the above-described technique drastically reduces power consumption. In addition, the above-described technique of sensing a HIT/MISS, results in an ultra-low power CAM with a highly reduced peak current profile, thereby resulting in reduction of de-coupling capacitance (de-cap) area.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

What is claimed is:

1. A system for comparing search data with content data stored in a ternary content addressable memory (TCAM) unit, comprising:

a first static logic gate for comparing a first content data with a first search data; and a second static logic gate coupled to the first static logic gate for comparing a second content data with a second search data, wherein the content data comprises the first content data and the second content data and the search data comprises the first search data and the second search data;

wherein the first static logic gate forwards a signal for disabling the second static logic gate if the first content data does not match with the first search data, and wherein the first static logic gate is enabled by an enable signal to a bridging nmos transistor and the second static logic gate is enabled by an enable signal to a bridging pmos transistor.

2. The system of claim 1, wherein the first static logic gate of the TCAM comprises two parallel paths of two pmos transistors in series serially coupled with two parallel paths of two nmos transistors in series via the bridging nmos transistor, with source nodes of two respective ones of the pmos transistors connected to a positive power supply and with source nodes of two respective ones of the nmos transistors connected to a negative power supply; and wherein the second static logic gate of the TCAM comprises two parallel paths of two pmos transistors in series serially coupled with two parallel paths of two nmos transistors in series via the bridging pmos transistor, with source nodes of two respective ones of the pmos transistors connected to a positive power supply and with source nodes of two respective ones of the nmos transistors connected to a negative power supply.

3. The system of claim 2, wherein a drain of the bridging nmos is an output node of the first static logic gate, and the output node of the first static logic gate is at logical low if the first content data matches with the first search data; and wherein a drain of the bridging pmos is an output node of the second static logic gate, and the output node of the second static logic gate is at logical high if the second content data matches with the second search data.

4. The system of claim 3, wherein the first static logic gate further comprises an additional pmos transistor with a source node of the additional pmos transistor connected to the positive power supply, a drain node of the additional pmos transistor connected to a drain node of the bridging nmos transistor, and a gate node of the additional pmos transistor connected to a gate node of the bridging nmos transistor.

5. The system of claim 4, wherein the second static logic gate further comprises an additional nmos transistor with a source node of the additional nmos transistor connected to the negative power supply, a drain node of the additional nmos transistor connected to a drain node of the bridging pmos transistor, and a gate node of the additional nmos transistor connected to a gate node of the bridging pmos transistor.

6. The system of claim 5, wherein the first static logic gate is operable only if the bridging nmos is turned on by a high logic signal from the positive power supply or a previous match module, and the second static logic gate is operable only if the bridging pmos is turned on by a low logic signal forwarded by the first static logic gate.

7. A system for comparing search data with content data stored in a ternary content addressable memory (TCAM) unit, comprising:

a first static logic gate for comparing a first content data with a first search data; and a second static logic gate coupled to the first static logic gate for comparing a second content data with a second search data, wherein the content data comprises the first content data and the second content data and the search data comprises the first search data and the second search data; and wherein the first static logic gate forwards a signal for disabling the second static logic gate if the first content data does not match with the first search data, and wherein the first static logic gate is enabled by an enable signal to bridging pmos transistor and the second static logic gate is enabled by an enable signal to a bridging pmos transistor.

8. The system of claim 7, wherein the first static logic gate of the TCAM comprises two parallel paths of two pmos transistors in series serially coupled with two parallel paths of two nmos transistors in series via the bridging pmos transistor, with source nodes of two respective ones of the pmos transistors connected to a positive power supply and with source nodes of two respective ones of the nmos transistors connected to a negative power supply; and wherein the second static logic gate of the TCAM comprises two parallel paths of two pmos transistors in series serially coupled with two parallel paths of two nmos transistors in series via the bridging nmos transistor, with source nodes of two respective ones of the pmos transistors connected to a positive power supply and with source nodes of two respective ones of the nmos transistors connected to a negative power supply.

9. The system of claim 8, wherein a drain of the bridging pmos is an output node of the first static logic gate, and the output node of the first static logic gate is at logical high if the first content data matches with the first search data; and wherein a drain of the bridging nmos is an output node of the second static logic gate, and the output node of the second static logic gate is at logical low if the second content data matches with the second search data.

10. The system of claim 9, wherein the first static logic gate further comprises an additional nmos transistor with a source node of the additional nmos transistor connected to the negative power supply, a drain node of the additional nmos transistor connected to a drain node of the bridging pmos transistor, and a gate node of the additional nmos transistor connected to a gate node of the bridging pmos transistor.

11. The system of claim 10, wherein the second static logic gate further comprises an additional pmos transistor with a source node of the additional pmos transistor connected to the positive power supply, a drain node of the additional pmos transistor connected to a drain node of the bridging nmos transistor, and a gate node of the pmos transistor connected to a gate node of the bridging nmos transistor.

12. The system of claim 11, wherein the first static logic gate is operable only if the bridging pmos is turned on by a low logic signal from the negative power supply or a previous match module, and the second static logic gate is operable only if the bridging nmos is turned on by a high logic signal forwarded by the first static logic gate.

13. A system for ternary content addressable memory (TCAM), comprising:

a chain of (TCAM) units for storing content word and comparing the content word with search word, with each CAM unit comprising:

a storage unit for storing content data, comprising:

a first storage unit of the storage unit for storing a first content data; and
a second storage unit of the storage unit for storing a second content data; and
a match module for comparing the content data with respective search data comprising:
a first static logic gate for comparing the first content data with a first search data; and
a second static logic gate coupled to the first static logic gate for comparing the second content data with a second search data,
wherein the content data comprises the first content data and the second content data and the search data comprises the first search data and the second search data;
wherein the first static logic gate forwards a signal for disabling the second static logic gate if the first content data does not match with the first search data;
wherein the content data is a portion of the content word and the search data is a portion of the search word; and
wherein the comparing the content word with the search word is performed sequentially from one end of the chain of CAM units to the other end of the chain of CAM units,
wherein the first static logic gate comprises two parallel paths of two pmos transistors in series serially coupled with two parallel paths of two pnmos transistors in series via a bridging nmos transistor, with source nodes of two respective ones of the pmos transistors connected to a positive power supply and with source nodes of two respective ones of the nmos transistors connected to a negative power supply; and
wherein the second static logic gate of the TCAM comprises two parallel paths of two pmos transistors in series serially coupled with two parallel paths of two nmos transistors in series via a bridging pmos transistor, with source nodes of two respective ones of the pmos transistors connected to a positive power supply and with source nodes of two respective ones of the nmos transistors connected to a negative power supply.

14. The system of claim 13, wherein each one of the first storage unit and the second storage unit comprises two six-transistor SRAM bit cells.

15. A system for ternary content addressable memory (TCAM), comprising:
a chain of TCAM units for storing content word and comparing the content word with search word, with each CAM unit comprising:
a storage unit for storing content data, comprising:
a first storage unit of the storage unit for storing a first content data; and
a second storage unit of the storage unit for storing a second content data; and
a match module for comparing the content data with respective search data, comprising:
a first static logic gate for comparing the first content data with a first search data; and
a second static logic gate coupled to the first static logic gate for comparing the second content data with a second search data,
wherein the content data comprises the first content data and the second content data and the search data comprises the first search data and the second search data;
wherein the first static logic gate forwards a signal for disabling the second static logic gate if the first content data does not match with the first search data;
wherein the content data is a portion of the content word and the search data is a portion of the search word; and
wherein the comparing the content word with the search word is performed sequentially from one end of the chain of CAM units to the other end of the chain of CAM units,
wherein the first static logic gate comprises two parallel paths of two pmos transistors in series serially coupled with two parallel paths of two nmos transistors in series via a bridging pmos transistor, with source nodes of two respective ones of the pmos transistors connected to a positive power supply and with source nodes of two respective ones of the nmos transistors connected to a negative power supply; and
wherein the second static logic gate of the TCAM comprises two parallel paths of two pmos transistors in series serially coupled with two parallel paths of two nmos transistors in series via a bridging nmos transistor, with source nodes of two respective ones of the pmos transistors connected to a positive power supply and with source nodes of two respective ones of the nmos transistors connected to a negative power supply.

* * * * *